United States Patent
Liu et al.

(10) Patent No.: US 10,074,302 B2
(45) Date of Patent: Sep. 11, 2018

(54) DISPLAY APPARATUS

(71) Applicant: Chunghwa Picture Tubes, LTD., Taoyuan (TW)

(72) Inventors: Sheng-Fa Liu, Hsinchu County (TW); Ji-Yi Chiou, Taichung (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 151 days.

(21) Appl. No.: 14/673,885

(22) Filed: Mar. 31, 2015

(65) Prior Publication Data

US 2016/0293098 A1  Oct. 6, 2016

(51) Int. Cl.
G09G 5/00 (2006.01)
G09G 3/3208 (2016.01)
(Continued)

(52) U.S. Cl.
CPC ........ *G09G 3/3208* (2013.01); *H01L 27/3211* (2013.01); *H01L 27/3227* (2013.01);
(Continued)

(58) Field of Classification Search
CPC .. G09G 3/3208; G09G 3/2003; G09G 3/2085; G09G 2330/023;
(Continued)

(56) References Cited

U.S. PATENT DOCUMENTS

2005/0023975 A1* 2/2005 Lee ................... H01L 27/288
313/512

2005/0230775 A1* 10/2005 Watanabe ......... H01L 27/14692
257/444
(Continued)

FOREIGN PATENT DOCUMENTS

CN 101852947 10/2010
CN 104375313 2/2015
(Continued)

OTHER PUBLICATIONS

"Office Action of Taiwan Counterpart Application", dated Apr. 20, 2016, p. 1-p. 8.
(Continued)

*Primary Examiner* — Dismery Mercedes
*Assistant Examiner* — Brent D Castiaux
(74) *Attorney, Agent, or Firm* — JCIPRNET

(57) ABSTRACT

A display apparatus including a first substrate, a second substrate opposite to the first substrate, a pixel array disposed between the first substrate and the second substrate and a photoelectric conversion array disposed between the pixel array and the second substrate is provided. The pixel array includes sub-pixel units. An initial light from each of the sub-pixel units is converted into an electrical energy and a display light by the photoelectric conversion array. The electrical energy is stored and the display light passes through the second substrate to display an image. Display lights presented by two adjacent sub-pixel units have different wavelengths. The photoelectric conversion array includes photoelectric conversion cells. An area of each of the photoelectric conversion cells covers the two adjacent sub-pixel units and partially overlaps an area of another photoelectric conversion cell. Different photoelectric conversion cells covering the same sub-pixel unit have different absorption wavelengths.

17 Claims, 4 Drawing Sheets

(51) Int. Cl.
*H01L 27/32* (2006.01)
*H01L 31/0749* (2012.01)
*H01L 31/073* (2012.01)

(52) U.S. Cl.
CPC ........ *H01L 31/073* (2013.01); *H01L 31/0749* (2013.01); *G09G 2330/023* (2013.01); *G09G 2360/145* (2013.01); *H01L 27/322* (2013.01); *Y02E 10/541* (2013.01); *Y02E 10/543* (2013.01)

(58) Field of Classification Search
CPC ... G09G 2300/0452; G09G 2300/0469; G09G 2360/145; H01L 27/3272; H01L 27/3227; H01L 27/3211; H01L 27/322; H01L 31/0749
See application file for complete search history.

(56) References Cited

U.S. PATENT DOCUMENTS

| | | | | |
|---|---|---|---|---|
| 2006/0186408 | A1* | 8/2006 | Misawa | H01L 27/14621 257/59 |
| 2009/0108757 | A1* | 4/2009 | Lee | H01L 27/288 315/51 |
| 2010/0245731 | A1* | 9/2010 | Limketkai | G02B 5/201 349/106 |
| 2011/0048490 | A1* | 3/2011 | Bernius | H01L 31/0322 136/244 |
| 2011/0108856 | A1* | 5/2011 | Wu | H01L 27/288 257/80 |
| 2011/0139222 | A1* | 6/2011 | Kueper | H01L 31/03923 136/249 |
| 2015/0163464 | A1* | 6/2015 | Egawa | H04N 9/045 348/274 |

FOREIGN PATENT DOCUMENTS

| | | |
|---|---|---|
| TW | 200637047 | 10/2006 |
| TW | 201217858 | 5/2012 |
| TW | M432144 | 6/2012 |
| TW | 201306435 | 2/2013 |
| TW | 201339658 | 10/2013 |
| TW | 201407843 | 2/2014 |

OTHER PUBLICATIONS

Andriesh et al., "Preparation of CIGS solar cell components by improved E-beam ablation technology and control of their final parameters" Semiconductor Conference, 2002. CAS 2002 Proceedings. International, vol. 1, Oct. 2002, pp. 199-202.

Office Action of China Counterpart Application, dated Jun. 27, 2018, pp. 1-8.

* cited by examiner

DISPLAY APPARATUS

BACKGROUND

Field of the Invention

The invention relates to an optoelectronic apparatus and more particularly, to a display apparatus.

Description of Related Art

When being divided according to types of display media, display apparatuses may be categorized into various types, such as liquid crystal display (LCD) apparatuses, organic light-emitting diode (OLED) display apparatuses, electrophoretic display apparatuses. Therein, the OLED display apparatuses advantage in having easy way for slimming, high color saturation and so on and thus, have been highly valued in recent years.

Generally, colorization mechanisms of the OLED display apparatuses may include two types. In one of the colorization mechanisms, an OLED apparatus has a plurality of organic light-emitting units capable of emitting red, green and blue lights and can display color images by using the organic light-emitting unit of each color light. However, under limitations that the red, the green and the blue organic light-emitting units require higher process capability, and material prices remain high, such type of display apparatuses is not applied widely. In the other colorization mechanism, an OLED display apparatus can utilize the organic light-emitting units (e.g., white-light OLED layers) capable of emitting lights operated with a color filter array to display color images. Benefiting from simple manufacturing process of the organic light-emitting units (e.g., the white-light OLED layers) and matured technique of the color filter array, such type of display apparatuses are applied in a relatively wide range. However, due to a filtering function of the color filter array significantly consuming light energy from the display units, such type of display apparatuses still has a disadvantage of energy consuming.

SUMMARY

The invention provides a display apparatus capable of display color images and utilizing energy more efficiently.

The invention relates to a display apparatus, including a first substrate, a second substrate opposite to the first substrate, a pixel array disposed between the first substrate and the second substrate and a photoelectric conversion array between the pixel array and the second substrate. The pixel array includes a plurality of sub-pixel units. An initial light from each of the sub-pixel units is converted into an electrical energy and a display light by the photoelectric conversion array. The electrical energy is stored, and the display light passes through the second substrate to display an image. Display lights presented by two adjacent sub-pixel units have different wavelengths. The photoelectric conversion array includes a plurality of photoelectric conversion cells. An area of each of the photoelectric conversion cells covers the two adjacent sub-pixel units and partially overlaps an area of another photoelectric conversion cell. Different photoelectric conversion cells covering the same sub-pixel unit have different absorption wavelengths.

In an embodiment of the invention, the sub-pixel units include a plurality of first sub-pixel units, a plurality of second sub-pixel units and a plurality of third sub-pixel units. The photoelectric conversion cells include a plurality of first photoelectric conversion cells, a plurality of second photoelectric conversion cells and a plurality of third photoelectric conversion cells. Each first photoelectric conversion cell, each second photoelectric conversion cell and each third photoelectric conversion cell have different absorption wavelengths. Each first sub-pixel unit is covered by one of the second photoelectric conversion cells and one of the third photoelectric conversion cells which overlap with each other and are exposed by the first photoelectric conversion cells, such that the display light converted from the initial light from each first sub-pixel unit has a first color. Each second sub-pixel unit is covered by one of the first photoelectric conversion cells and one of the third photoelectric conversion cells which overlap with each other and are exposed by the second photoelectric conversion cells, such that the display light converted from the initial light from each second sub-pixel unit has a second color. Each third sub-pixel unit is covered by one of the first photoelectric conversion cells and one of the second photoelectric conversion cells which overlap with each other and are exposed by the third photoelectric conversion cells, such that the display light converted from the initial light from each third sub-pixel unit has a third color.

In an embodiment of the invention, a range of the absorption wavelength of each first photoelectric conversion cell is greater than 620 nm.

In an embodiment of the invention, a range of the absorption wavelength of each second photoelectric conversion cell is between 500 nm and 620 nm.

In an embodiment of the invention, a range of the absorption wavelength of each third photoelectric conversion cell is equal to or less than 500 nm.

In an embodiment of the invention, the first photoelectric conversion cells are more adjacent to the pixel array than the second photoelectric conversion cells and the third photoelectric conversion cells, and the absorption wavelengths of the first photoelectric conversion cells are longer than the absorption wavelengths of the second photoelectric conversion cells and the absorption wavelengths of the third photoelectric conversion cells.

In an embodiment of the invention, each first photoelectric conversion cell overlaps one of the second photoelectric conversion cells and one of the third photoelectric conversion cells to define a light shielding region. A region between two adjacent first photoelectric conversion cells defines a light transmission region, a region between two adjacent second photoelectric conversion cells defines a light transmission region, and a region between two adjacent third photoelectric conversion cells defines a light transmission region.

In an embodiment of the invention, each sub-pixel unit includes an active device and a display unit electrically connected with the active device.

In an embodiment of the invention, the display unit is an organic light-emitting diode (OLED).

In an embodiment of the invention, the display apparatus further includes an electricity storage unit and a driving unit. The electricity storage unit is electrically connected among the photoelectric conversion cells to store the electrical energy. The driving unit is electrically connected between the electricity storage unit and the pixel array. The driving unit drives the sub-pixel units using the electrical energy.

In an embodiment of the invention, the display apparatus further includes an electrical-energy adjusting unit electrically connected between each photoelectric conversion cell and the electricity storage unit. The electrical-energy adjusting unit receives the electrical energy provided by the photoelectric conversion cells having different absorption wavelengths, adjusts the electrical energy and then transmits the adjusted electrical energy to the electricity storage unit for storing.

In an embodiment of the invention, the display apparatus further includes a plurality of insulating layers. The insulating layers are disposed between the photoelectric conversion cells covering the same sub-pixel unit.

In an embodiment of the invention, the display apparatus further includes a color filter array disposed between the second substrate and the photoelectric conversion array.

In an embodiment of the invention, each photoelectric conversion cell includes a first electrode, a photoelectric conversion structure and a second electrode which stack in sequence.

In an embodiment of the invention, the photoelectric conversion structure includes an absorber and an emitter.

In an embodiment of the invention, the absorbers of the photoelectric conversion cells covering the same sub-pixel unit have different absorption wavelengths.

In an embodiment of the invention, a material of the absorber comprises CuInSe, $CuInGa_{(1-x)}Se_2$, CuInGaSeS or a stacked layer of at least two of CuInSe, $CuInGa_{(1-x)}Se_2$, and CuInGaSeS, where x is less than 1.

In an embodiment of the invention, a material of the emitter comprises CdS, (Cd,Zn)S, an n-type compound semiconductor material or a combination thereof.

To sum up, the display apparatus of one of the embodiments of the invention can display color images through the photoelectric conversion array disposed above the pixel array. Moreover, the display apparatus can convert the light from the pixel array into the electrical energy for storing, so as to enhance energy utilization efficiency.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
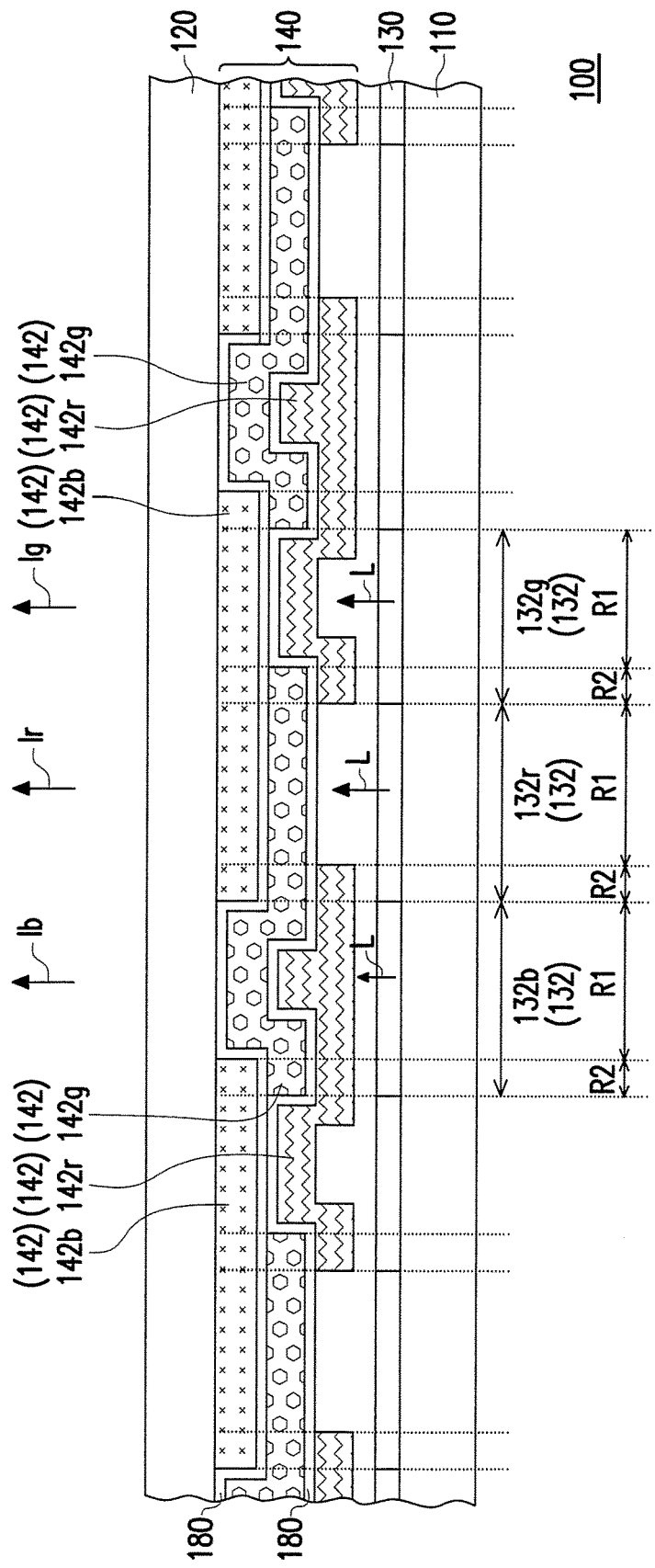
FIG. 1 is a schematic cross-sectional diagram of a display apparatus according to an embodiment of the invention.

FIG. 1 is a schematic cross-sectional diagram of a display apparatus according to an embodiment of the invention. With reference to FIG. 1, a display apparatus 100 includes a first substrate 110, a second substrate 120 opposite to the first substrate 110, a pixel array 130 between the first substrate 110 and the second substrate 120 and a photoelectric conversion array 140 disposed between the pixel array 130 and the second substrate 120. In the present embodiment, the first substrate 110 may be a light transmission substrate, a light shielding substrate or a combination thereof, and the second substrate 120 may be a light transmission substrate or a combination of a light transmission substrate and a light shielding substrate. A material of the light transmission substrate includes, for example, glass, quartz, an organic polymer or any other appropriate material. A material of the light shielding substrate includes, for example, conductive material, a wafer, ceramics or any other appropriate material.

The pixel array 130 includes a plurality of sub-pixel units 132. In the present embodiment, the sub-pixel units 132 may be selectively divided into a plurality of first, second and third sub-pixel units 132r, 132g and 132b. A region corresponding to the first sub-pixel units 132r is used to provide a display light 1r having a first color. A region corresponding to the second sub-pixel units 132g is used to provide a display light 1g having a second color. A region corresponding to the third sub-pixel units 132b is used to provide a display light 1b having a third color. The display lights 1r, 1g and 1b may be mixed to form a white light. In the present embodiment, the first, the second and the third colors of the display lights 1r, 1g and 1b are, for example, red, green and blue, respectively. However, the invention is not limited thereto, and types of the colors of the display lights and the number of each type of sub-pixel units (i.e., the number of colors of the display lights) may be adaptively designed depending on actual requirements. For instance, in other embodiments, for enhancing color saturation of the display apparatus, the display lights may include red, green, blue and yellow lights, and the types of the sub-pixel units may be corresponding to the red, the green, the blue and the yellow lights; while for enhancing brightness of the display apparatus, the display lights may include red, green, blue and white lights, and the types of the sub-pixel units may be corresponding to the red, the green, the blue and the white lights, but the invention is not limited thereto.

Figure 2:
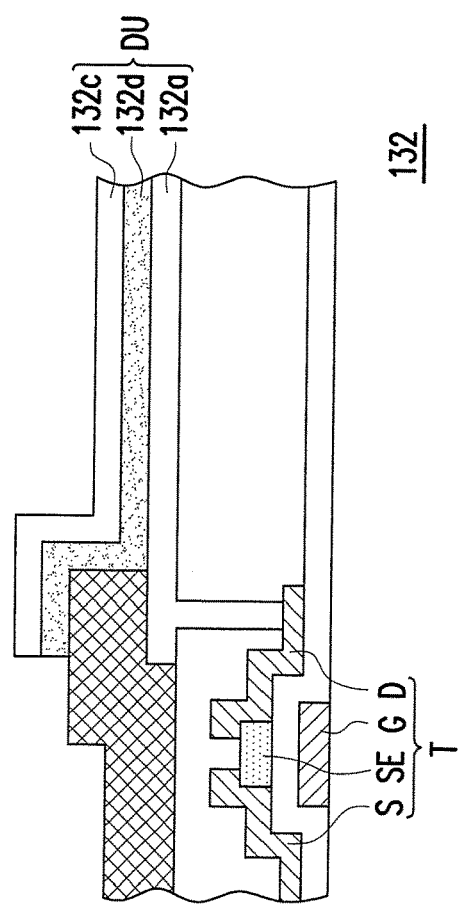
FIG. 2 is a schematic cross-sectional diagram of a sub-pixel unit according to an embodiment of the invention.

FIG. 2 is a schematic cross-sectional diagram of a sub-pixel unit according to an embodiment of the invention. With reference to FIG. 2, in the present embodiment, each sub-pixel unit 132 includes an active device T and a display unit DU electrically connected with the active device. The active device T is, for example, a thin-film transistor having a source S, a gate G, a drain D and a channel SE. The active device T of FIG. 2 is illustrated as a bottom-gate thin film transistor for example, but the invention is not limited thereto, and in other embodiments, the active device T may also be a top-gate thin film transistor, a thin-film transistor in any other form or any other electronic device. The display unit DU is, for example, an organic light-emitting diode (OLED) and includes a first display electrode 132a, a display medium 132d disposed on the first display electrode 132a and a second display electrode 132c on the display medium 132d in the present embodiment. The first display electrode 132a is electrically connected with the drain D of the active device T. One of the first display electrode 132a and the second display electrode 132c serves as an anode, and the other serves as a cathode to control whether the display medium 132d emits light. The display medium 132d may be, for example, a white organic light-emitting layer capable of emitting a white initial light L. Materials of the first display electrode 132a and the second display electrode 132c may be any conductive materials. However, in order to allow the white initial light L to pass through, a material of the second display electrode 132c may be selected from a light transmission conductive material or a combination of a light transmission conductive material and a light shielding conductive material. For instance, the light transmission conductive material may be, for example, indium-tin-oxide (ITO), indium zinc oxide (IZO), aluminum tin oxide (ATO), aluminum doped zinc oxide (AZO), indium germanium zinc oxide (IGZO), other suitable oxides, or a stacked layer of at least two of the above, while the light shielding conductive material may be, for example, an alloy, a metal nitride material, a metal oxide material, a metal oxynitride material or a stacked layer of a metal material and another conductive material, but the invention is not limited thereto.

It should be noted that FIG. 2 and the type of the sub-pixel unit above are illustrated for describing the invention, instead of construing limitations to the invention. The sub-pixel units of the invention are not limited to the OLED sub-pixel units, and in other embodiments, the sub-pixel units may be in other suitable forms. For instance, in other embodiments, the display medium 132d disposed on the first display electrode 132a may be other types, such as liquid crystal. In this way, the first display electrode 132a and the second display electrode 132c may respectively serve as a pixel electrode and a common electrode. In the design that the display medium is sandwiched between the pixel electrode and the common electrode, the sub-pixel units may be pixel units arranged in a twisted nematic (TN) mode or a Vertically Aligned (VA) mode. Additionally, in other embodiments, when the liquid crystals serve as the display medium, the common electrode and the pixel electrode may be simultaneously located at one side of the display medium. In this circumstance, the sub-pixel units may be in-plane switching (IPS) type or fringe field switching (FFS) mode sub-pixel units.

With reference to FIG. 1, the photoelectric conversion array 140 includes a plurality of photoelectric conversion cells 142. In the present embodiment, a plurality of photoelectric conversion cells 142 may be selectively divided into a plurality of first, second and third photoelectric conversion cells 142r, 142g and 142b. The first photoelectric conversion cells 142r, the second photoelectric conversion cells 142g and the third photoelectric conversion cells 142b respectively have different absorption wavelengths. For instance, the first photoelectric conversion cells 142r are used to absorb the red light, the second photoelectric conversion cells 142g are used to absorb the green light, and the third photoelectric conversion cells 142b are used to absorb the blue light. Each first sub-pixel units 132r is covered by one of the second photoelectric conversion cells 142g and one of the third photoelectric conversion cells 142b that overlap with each other and are exposed by the first photoelectric conversion cells 142r. Each second sub-pixel unit 132g is covered by one of the first photoelectric conversion cells 142r and one of the third photoelectric conversion cells 142b that overlap with each other and are exposed by the second photoelectric conversion cells 142g. Each third sub-pixel units 132b is covered by one of the first photoelectric conversion cells 142r and one of the second photoelectric conversion cells 142g and are exposed by the third photoelectric conversion cells 142b. However, the invention is not limited thereto, and the number of types of the photoelectric conversion cells, the absorption wavelengths of each type of the photoelectric conversion cells and relative positions between each type of the photoelectric conversion cells and each type of the sub-pixel units may be adaptively designed depending on actual requirements.

Figure 3:
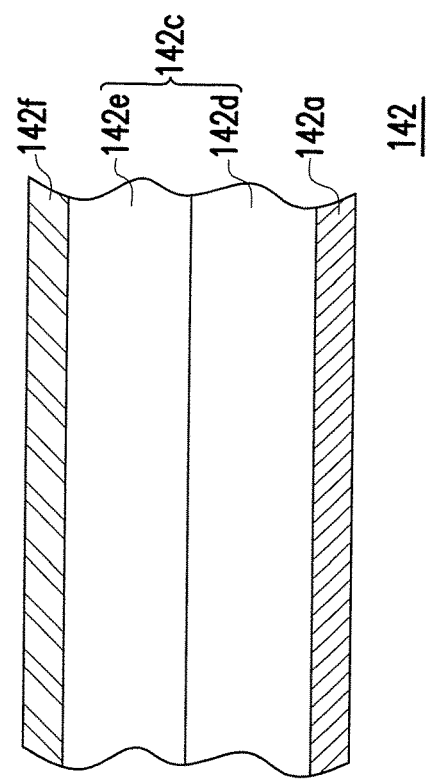
FIG. 3 is a schematic cross-sectional diagram of a photoelectric conversion cell according to an embodiment of the invention.

FIG. 3 is a schematic cross-sectional diagram of a photoelectric conversion cell according to an embodiment of the invention. With reference to FIG. 3, in the present embodiment, each photoelectric conversion cell 142 includes a first electrode 142a, a second electrode 142f opposite to the first electrode 142a and a photoelectric conversion structure 142c disposed between the first and the second electrodes 142a and 142f. A portion of the initial light L (shown in FIG. 1) from the sub-pixel units passing through the first electrode 142a, the photoelectric conversion structure 142c and the second electrode 142f is converted into an electrical energy. In other words, each photoelectric conversion cell may be considered as a photovoltaic cell structure. The first and the second electrodes 142a and 142f may be light-transmission conductive layers. The light-transmission conductive layers may be made of, for example, ITO, IZO, ATO, IGZO, other suitable oxides, or a stacked layer of at least two of the above, but the invention is not limited thereto.

In detail, the photoelectric conversion structure 142c of the photoelectric conversion cell 142 may include an absorber 142d and an emitter 142e disposed between the second electrode 142f and the absorber 142d. The absorber 142c is, for example, a semiconductor layer with a specific bandgap. For instance, an absorber 142d of each first photoelectric conversion cell 142r may have a bandgap ranging from 1 to 1.2 electron volts (eV) to absorb red and infrared lights with wavelengths that are equal to or more than 620 nm; an absorber 142d of each second photoelectric conversion cells 142g may have a bandgap ranging from 1.3 to 1.5 eV to absorb a green light having with a wavelength that is between 500 to 620 nm; and an absorber 142d of each third photoelectric conversion cells 142b may have a bandgap ranging from 1.6 to 1.8 eV to absorb blue, violet and ultraviolet lights with wavelengths that are equal to or less than 500 nm.

In the present embodiment, a material of the absorber 142d includes, for example, CuInSe, CuInGa$_{(1-x)}$Se$_2$, CuInGaSeS or a stacked layer of at least two of the above. If the material of the absorber 142d includes CuInGa$_{(1-x)}$Se$_2$, in which x is between 0 and 1, the absorber 142d may have a specific bandgap by means of adaptively designing the x value, so as to absorb lights (e.g., the red, green and blue lights as mentioned above) with a wavelength within a specific range. For instance, according to "Preparation of GIGS solar cell components by improved e-beam ablation technology and control of their final parameters" presented in pages 199-202, "Semiconductor Conference, 2002. CAS 2002 Proceedings. International (Volume: 1)", when x is 0, 0.25 or 1.0, the material of CuInGa$_{(1-x)}$Se$_2$ may have a bandgap of 1.0, 1.4 or 1.65 eV. Therefore, in the case the absorber 142d is manufactured by using the material of CuInGa$_{(1-x)}$Se$_2$, the required bandgap may be obtained by adjusting the x value. However, the adjustment of the bandgap of the absorber 142d is not limited to the above, and in other embodiments, the bandgap of the absorber 142d may be adjusted in another adaptive way (e.g., by changing a carrier doping concentration, a crystallinity degree, or the like of the absorber 142d). A material of the emitter 142e may include CdS, (Cd,Zn)S, an n-type compound semiconductor material or any other adaptive material. The n-type compound semiconductor material is, for example but not limited thereto, an n-type II-VI group compound semiconductor, such as ZnSe or CdSe, but the invention is not limited thereto.

It should be noted that the semiconductor photovoltaic cell structure is illustrated as an example for describing one aspect of the photoelectric conversion cells; however, the type of the photoelectric conversion cells in the invention is not limited to the semiconductor photovoltaic cell structure. In other embodiments, the photoelectric conversion cells may include other suitable forms of photovoltaic cell structure, such as a dye-sensitized photovoltaic cell structure, a photovoltaic cell structure made of polymer blended with C60 and its derivatives, a photovoltaic cell structure made of polymer blended with inorganic nano-particles, a photovoltaic cell structure made of an organic blended material.

Figure 4:
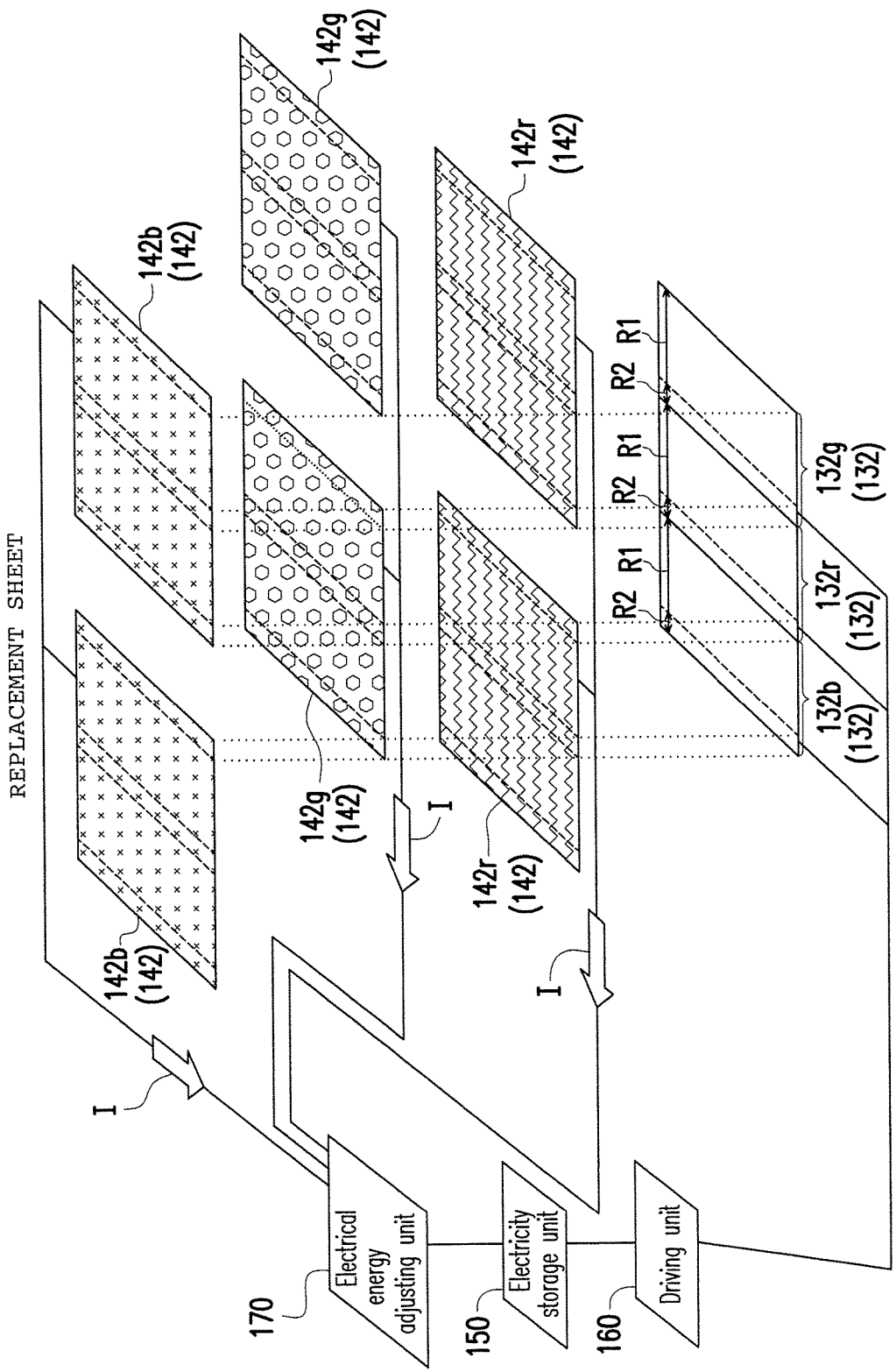
FIG. 4 is a schematic diagram illustrating a portion of the pixel array, a portion of the photoelectric conversion array, the electrical-energy adjusting unit, the electricity storage unit and the driving unit of the display apparatus according to an embodiment of the invention.

FIG. 4 is a schematic diagram illustrating a portion of the pixel array, a portion of the photoelectric conversion array, the electrical-energy adjusting unit, the electricity storage unit and the driving unit of the display apparatus according to an embodiment of the invention. With reference to FIG. 1 and FIG. 4, an initial light L emitted from the each sub-pixel unit and passing through the photoelectric conversion array 140 is converted into an electrical energy I and display lights 1r, 1g and 1b. An area of each photoelectric conversion cell 142 covers two adjacent sub-pixel units 132 and partially overlap an area of another photoelectric conversion cell, and different photoelectric conversion cells 142 covering the same sub-pixel unit 132 have different absorption wavelengths. In this way, when the initial light L passes through different photoelectric conversion cells 142 above the same sub-pixel unit 132, a portion of the initial light L is absorbed by the overlapping different photoelectric conversion cells 142, such that the display lights 1r, 1g and 1b present specific colors. In addition, the display lights 1r and 1g presented by the two adjacent sub-pixel units 132 further has different wavelengths (i.e., different colors). As such, the display lights 1r, 1g and 1b from all the sub-pixel units 132 are capable of forming a color display image.

For instance, the initial light L (e.g., a white light) from each first sub-pixel unit 132r is partially absorbed by one of the second photoelectric conversion cells 142g and one of the third photoelectric conversion cells 142b that overlap with each other and passes through the second substrate 120 to form the display light 1r having a first color (e.g., red). The initial light L from each second sub-pixel unit 132g is partially absorbed by one of the first photoelectric conversion cells 142r and one of the third photoelectric conversion cells 142b that overlap with each other and passes through the second substrate 120 to form the display light 1g having a second color (e.g., green). The initial light L from each third sub-pixel unit 132b is partially absorbed by one of the first photoelectric conversion cells 142r and one of the second photoelectric conversion cells 142g that overlap with each other and passes through the second substrate 120 to form the display light 1b having a third color (e.g., blue). The display lights 1r, 1g and 1b from the first, the second and the third sub-pixel units 132r, 132g and 132b are capable of forming an image having specific colors.

Referring to FIG. 1 and FIG. 4, in the present embodiment, each first photoelectric conversion cell 142r overlapping one of the second photoelectric conversion cells 142g and one of the third photoelectric conversion cells 142b defines a light shielding region R2. A region between two adjacent first photoelectric conversion cells 142r defines a light transmission region R1, a region between two adjacent second photoelectric conversion cells 142g defines a light transmission region R1, and a region between two adjacent third photoelectric conversion cells 142b defines a light transmission region R1. Each light transmission region R1 overlaps the first display electrode 132a (shown in FIG. 2) of one of the sub-pixel units 132. Each light shielding region R2 overlaps the active device T (shown in FIG. 2) of one of the sub-pixel units 132 and other light shielding elements (e.g., data lines, electrically connected with the source S of each active device T). The second photoelectric conversion cell 142g and the third photoelectric conversion cell 142b that overlap with each other in the light transmission region R1 of each first sub-pixel unit 132r further extend to a location above the light shielding region R2 of one first sub-pixel unit 132r, so as to overlap the first photoelectric conversion cell 142r covering the third sub-pixel unit 132b to jointly shield the initial light L from the pixel array 130. The first photoelectric conversion cell 142r and the third photoelectric conversion cell 142b that overlap with each other in the light transmission region R1 of each second sub-pixel units 132g further extend to a location above the light shielding region R2 of each second sub-pixel unit 132g, so as to overlap the second photoelectric conversion cell 142g covering the first sub-pixel units 132 to jointly shield the initial light L from the pixel array 130. The light transmission region R1 and the first photoelectric conversion cells 142r that overlap with each other in the third sub-pixel unit 132b of each second photoelectric conversion cell 142g further extend to a location above the light shielding region R2 of each third sub-pixel unit 132b, so as to overlap the third photoelectric conversion cell 142b covering the second sub-pixel unit 132g to jointly shield the initial light L from the pixel array 130. In other words, a portion of the first photoelectric conversion cells 142r, a portion of the second photoelectric conversion cells 142g and a portion of the third photoelectric conversion cells 142b that are stacked with one another in each light shielding region R2 may serve as light shielding layers. As such, the initial light L from each sub-pixel unit 132 can be prevented from transmitting to the photoelectric conversion cell 142 right above an adjacent sub-pixel unit 132, such that a probability and/or a degree of color abnormality of the displayed image occurring in the display apparatus 100 can be reduced.

In the present embodiment, the first photoelectric conversion cells 142r are closer to the pixel array 130 than the second and the third photoelectric conversion cells 142g and 142b, the absorption wavelengths of the first photoelectric conversion cells 142r are greater than the absorption wavelengths of the second and the third photoelectric conversion cells 142g and 142b. In other words, if the photoelectric conversion cells 142 disposed right above the sub-pixel units 132 include the first photoelectric conversion cells 142r, the initial light L first pass through each first photoelectric conversion cell 142r having the greatest absorption wavelength. In an initial light L, the portion having the longer wavelength has worse transmitting capability. Thus, if the first photoelectric conversion cell 142r having the longest absorption wavelength is disposed at the forefront end of a transmission path of the initial light L, the portion of the initial light L having the worse transmitting capability may be first absorbed and used, instead of being consumed by the other photoelectric conversion cells 142 having other absorption wavelengths. In this way, the photoelectric conversion array 140 can convert the initial light L into the electrical energy I more efficiently to be used by the display apparatus 100 or an external apparatus.

Referring to FIG. 1 and FIG. 4, the display apparatus 100 may selectively include an electricity storage unit 150 (shown in FIG. 4) electrically connected between the photoelectric conversion array 140 and the pixel array 130. The electricity storage unit 150 stores the electrical energy I converted from the photoelectric conversion array 140. In the present embodiment, the display apparatus 100 may further include a driving unit 160 electrically connected between the electricity storage unit 150 and the sub pixel array 130. The driving unit 160 drives the sub-pixel units using the electrical energy I. In other words, by using the specifically designed photoelectric conversion array 140, not only the display apparatus 100 can display color images, but also a portion of the initial light L that is consumed for achieving different colors is converted into the electrical energy I and stored. In the present embodiment, the electrical energy I may be further selectively transmitted to the driving unit 160 for the driving unit 160 to drive the sub-pixel units 132 using the electrical energy I, such that the display apparatus 100 may save more energy, that is, reduce the demand for external electrical energy.

In the present embodiment, the display apparatus 100 may selectively include insulating layers 180. The insulating layers 180 are disposed between the different photoelectric conversion cells covering the same sub-pixel unit. For instance, an insulating layer 180 is disposed between the second and the third photoelectric conversion cells 142g and 142b covering the same first sub-pixel unit 132r, an insulating layer 180 is disposed between the first and the third photoelectric conversion cells 142r and 142b covering the same second sub-pixel unit 132g, and an insulating layer 180 is disposed between the first and the second photoelectric conversion cells 142r and 142g covering the same third sub-pixel unit 132b. The insulating layers 180 may be made of an inorganic material (e.g., silicon oxide, silicon nitride, silicon oxynitride, or a stacked layer of at least two of the above), an organic material or a combination thereof. It is worth to be mentioned that through the disposition of the insulating layers 180, different electrical energy I (e.g., currents with different sizes) converted from the photoelectric conversion cells (e.g., the first, the second and the third photoelectric conversion cells 142r, 142g and 142b) having different absorption wavelengths may be respectively transmitted to the electrical-energy adjusting unit 170 electrically connected with the photoelectric conversion cells 142 and the electricity storage unit 150. When different electrical energy I is respectively transmitted, the electrical energy I can be stored by the electrical-energy adjusting unit 170 more efficiently. After receiving different electrical energy I, the electrical-energy adjusting unit 170 may adjust the electrical energy I to store the electrical energy I in the electricity storage unit 150 more efficiently.

Figure 5:
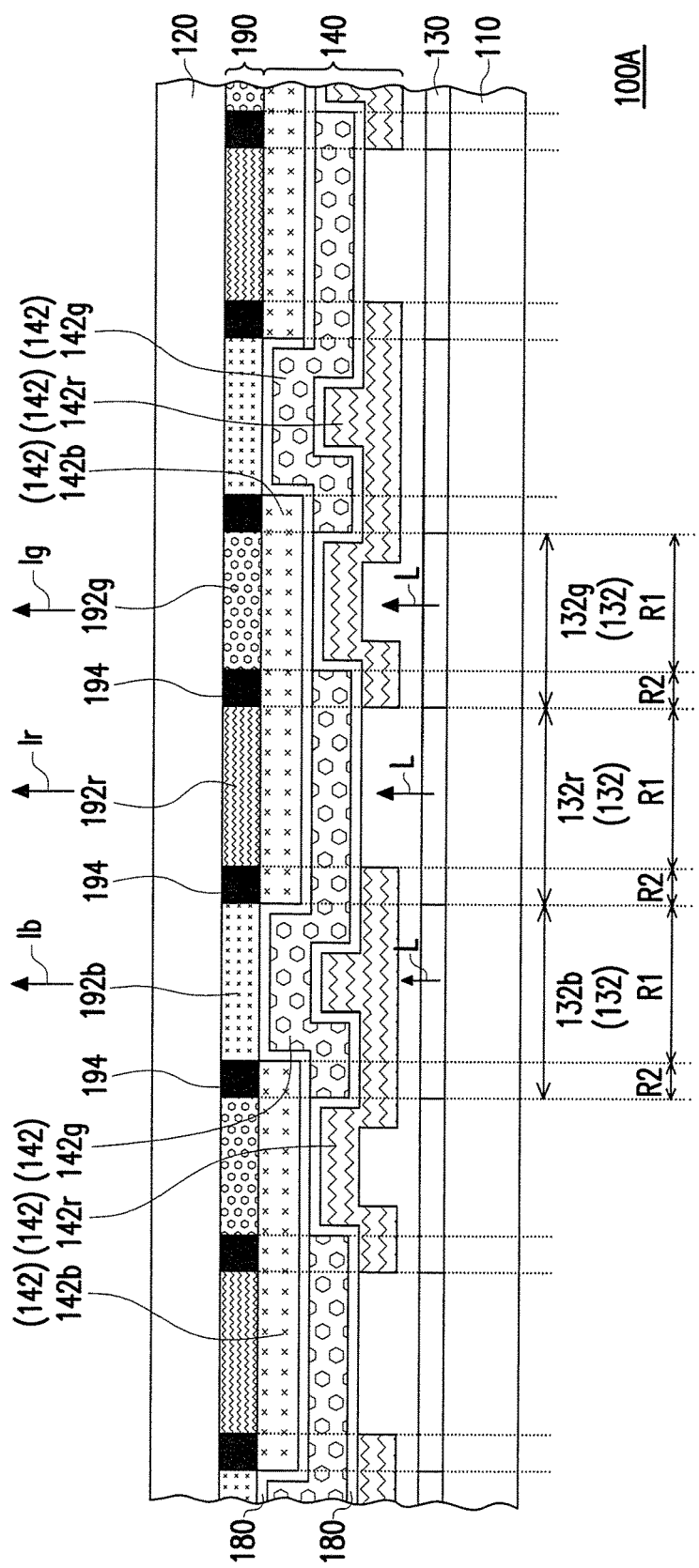
FIG. 5 is a schematic cross-sectional diagram of a display apparatus according to another embodiment of the invention.

FIG. 5 is schematic cross-sectional diagram of a display apparatus according to another embodiment of the invention. FIG. 5 illustrates a display apparatus 100A similar to the display apparatus 100 illustrated in FIG. 1, and thus, the same or similar reference numbers are used to label the same or similar elements. The display apparatus 100A is different from the display apparatus 100 in that the display apparatus 100A further includes a color filter array 190. The difference is discussed below, and the same parts of the two display apparatuses may refer to the descriptions set forth above according to the reference numbers in FIG. 5 which will not be repeated hereinafter.

With reference to FIG. 5, the display apparatus 100A includes a first substrate 110, a second substrate 120 opposite to the first substrate 110, a pixel array 130 disposed between the first substrate 110 and the second substrate 120 and a photoelectric conversion array 140 disposed between the pixel array 130 and the second substrate 120. The pixel array 130 includes a plurality of sub-pixel units 132. An initial light L from the each sub-pixel unit is converted by the photoelectric conversion array 140 into an electrical energy and a display light 1. The electrical energy is stored, and the display light 1 passes through the second substrate 120 to display an image. Display lights 1 presented by two adjacent sub-pixel units 132 have different wavelengths. The photoelectric conversion array 140 includes a plurality of photoelectric conversion cells 142. An area of each photoelectric conversion cells 142 covers two adjacent sub-pixel units 132 and partially overlaps an area of another photoelectric conversion cell 142. Different photoelectric conversion cells 142 covering the same sub-pixel unit 132 have different absorption wavelengths. In the present embodiment, the display apparatus 100A may selectively include an electricity storage unit 150, a driving unit 160 and an electrical-energy adjusting unit 170 illustrated in FIG. 4 as the display apparatus 100 does. Relationships among the electricity storage unit 150, the driving unit 160 and the electrical-energy adjusting unit 170 and other elements of the display apparatus 100A may refer to the description above and will not be repeated hereinafter.

The display apparatus 100A is different from the display apparatus 100 in that the display apparatus 100A further includes a color filter array 190. The color filter array 190 is disposed between the second substrate 120 and each of the photoelectric conversion cells. The color filter array 190 has a plurality of first, second, third filter patterns 192r, 192g and 192b and filter patterns 194. The first, the second and the third filter patterns 192r, 192g and 192b are respectively corresponding to the first, the second and the third sub-pixel units 132r, 132g and 132b and cover the light transmission regions R1, while the filter patterns 194 cover the light shielding regions R2. The first filter patterns 192r may further filter a portion of the initial light L that is not filtered by the second and third photoelectric conversion cells 142g and 142b, such that the display light 1r passing through the second substrate 120 has a narrower bandwidth to present a more saturated color. The second filter patterns 192g may further filter a portion of the initial light L that is not filtered by the first and the third photoelectric conversion cells 142r and 142b, such that the display light 1g passing through the second substrate 120 has a narrower bandwidth to present a more saturated color. The third filter patterns 192b may further filter a portion of the initial light L that is not filtered by the first and the second photoelectric conversion cells 142r, 142g, such that the display light 1b passing through the second substrate 120 has a narrower bandwidth to present a more saturated color. Thereby, the color saturation of the display apparatus 100A may be further enhanced. The filter patterns 194 may shield the initial light L in the light shielding region R2 that are not absorbed by the first, the second and the third photoelectric conversion cells 142r, 142g, 142b, such that the display apparatus 100A has a higher contrast.

Colors of the first, the second and the third filter patterns 192r, 192g and 192b may be determined according to colors to be displayed from where the first, the second and the third sub-pixel units 132r, 132g and 132b are located. In the present embodiment, the first, the second and the third filter patterns 192, 194 and 196 are, for example, red, green and blur filter patterns to be corresponding to the display lights 1r, 1g and 1b presented by the first, the second and the third sub-pixel units 132r, 132g and 132b, but the invention is not limited thereto.

In conclusion, the display apparatus of the embodiments of the invention can achieve the display of color images through the photoelectric conversion array. Furthermore, the manufacturing process of the photoelectric conversion array becomes matured, and process capability required by the photoelectric conversion array is less than the organic light-emitting unit of each color light in the conventional art. Thus, each photoelectric conversion cell of the photoelectric conversion array can be accurately manufactured on the set position to achieve the high-resolution design.

Moreover, by using the photoelectric conversion array, the display apparatus of the embodiments of the invention can convert the light consumed for achieving the colors into the electrical energy for storage and use. Therefore, the display apparatus of the embodiments of the invention can save the demand for the external energy as well as simultaneously achieve the display of color images.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A display apparatus, comprising:
    a first substrate;
    a second substrate, opposite to the first substrate;
    a pixel array, disposed between the first substrate and the second substrate and comprising a plurality of sub-pixel units;
    a photoelectric conversion array, disposed between the pixel array and the second substrate, wherein an initial light from each of the sub-pixel units is converted into an electrical energy and a display light, the electrical energy is stored, the display light passes through the second substrate to display an image, and display lights presented by two adjacent sub-pixel units have different wavelengths, wherein the photoelectric conversion array comprises a plurality of photoelectric conversion cells, an area of each of the photoelectric conversion cells covers two adjacent sub-pixel units and partially overlaps an area of another photoelectric conversion cell, and different photoelectric conversion cells covering the same sub-pixel unit have different absorption wavelengths; and
    a plurality of insulating layers, disposed between the photoelectric conversion cells covering the same sub-pixel unit, wherein only portions of the photoelectric conversion cells overlap with each other and the insulating layers are provided between the portions where the photoelectric conversion cells overlap each other, so that the photoelectric conversion cells are electrically insulated, wherein
    the photoelectric conversion cells comprise a plurality of first photoelectric conversion cells, a plurality of second photoelectric conversion cells and a plurality of third photoelectric conversion cells, each of the first photoelectric conversion cells overlaps one of the second photoelectric conversion cells and one of the third photoelectric conversion cells to define a light shielding region, a region between two adjacent first photoelectric conversion cells defines a light transmission region, a region between two adjacent second photoelectric conversion cells defines a light transmission region, and a region between two adjacent third photoelectric conversion cells defines a light transmission region.

2. The display apparatus according to claim 1, wherein the sub-pixel units comprise a plurality of first sub-pixel units, a plurality of second sub-pixel units and a plurality of third sub-pixel units, each of the first photoelectric conversion cells, each of second photoelectric conversion cells and each of third photoelectric conversion cells have different absorption wavelengths; each of the first sub-pixel units is covered by one of the second photoelectric conversion cells and one of the third photoelectric conversion cells which overlap with each other and are exposed by the first photoelectric conversion cells, such that the display light converted from the initial light from each of the first sub-pixel units has a first color; each of the second sub-pixel units is covered by one of the first photoelectric conversion cells and one of the third photoelectric conversion cells which overlap with each other and are exposed by the second photoelectric conversion cells, such that the display light converted from the initial light from each of the second sub-pixel units has a second color; and each of the third sub-pixel units is covered by one of the first photoelectric conversion cells is covered by one of the second photoelectric conversion cells which overlap with each other and are exposed by the third photoelectric conversion cells, such that the display light converted from the initial light from each of the third sub-pixel units has a third color.

3. The display apparatus according to claim 2, wherein a range of the absorption wavelength of each of the first photoelectric conversion cells is greater than 620 nm.

4. The display apparatus according to claim 2, wherein a range of the absorption wavelength of each of the second photoelectric conversion cells is between 500 nm and 620 nm.

5. The display apparatus according to claim 2, wherein a range of the absorption wavelength of each of the third photoelectric conversion cells is equal to or less than 500 nm.

6. The display apparatus according to claim 2, wherein the first photoelectric conversion cells are more adjacent to the pixel array than the second photoelectric conversion cells and the third photoelectric conversion cells, and the absorption wavelengths of the first photoelectric conversion cells are longer the absorption wavelengths of the second photoelectric conversion cells and the absorption wavelengths of the third photoelectric conversion cells.

7. The display apparatus according to claim 1, wherein each of the sub-pixel units comprises an active device and a display unit electrically connected with the active device.

8. The display apparatus according to claim 1, where the display unit is an organic light-emitting diode (OLED).

9. The display apparatus according to claim 1, further comprising:
    an electricity storage unit, electrically connected with the photoelectric conversion cells to store the electrical energy; and
    a driving unit, electrically connected between the electricity storage unit and the pixel array and driving the sub-pixel units using the electrical energy.

10. The display apparatus according to claim 9, further comprising an electrical-energy adjusting unit, electrically connected between each of the photoelectric conversion cells and the electricity storage unit, receiving the electrical energy provided by the photoelectric conversion cells having different absorption wavelengths, adjusting the electrical energy and transmitting the adjusted electrical energy to the electricity storage unit for storing.

11. The display apparatus according to claim 1, further comprising a color filter array, disposed between the second substrate and the photoelectric conversion array.

12. The display apparatus according to claim 1, wherein each of the photoelectric conversion cells comprises a first electrode, a photoelectric conversion structure and a second electrode which stack in sequence.

13. The display apparatus according to claim 12, wherein the photoelectric conversion structure comprises an absorber and an emitter.

14. The display apparatus according to claim 13, wherein the absorbers of the photoelectric conversion cells covering the same sub-pixel unit have different absorption wavelengths.

15. The display apparatus according to claim 13, wherein a material of the absorber comprises CuInSe, CuInGa(1-x)Se2, CuInGaSeS or a stacked layer of at least two of CuInSe, CuInGa(1-x)Se2, and CuInGaSeS, wherein x is less than 1.

16. The display apparatus according to claim 13, wherein a material of the emitter comprises CdS, (Cd,Zn)S, an n-type compound semiconductor material or a combination thereof.

17. A display apparatus, comprising:
a first substrate;
a second substrate, opposite to the first substrate;
a pixel array, disposed between the first substrate and the second substrate and comprising a plurality of sub-pixel units;
a photoelectric conversion array, disposed between the pixel array and the second substrate, the photoelectric conversion array comprising a first photoelectric conversion cell, a second photoelectric conversion cell and a third photoelectric conversion cell, a first portion of an area of the first photoelectric conversion cell overlaps an area of the second photoelectric conversion cell, and a second portion of the area of the first photoelectric conversion cell overlaps an area of the third photoelectric conversion cell, wherein an initial light from one of the sub-pixel units is converted into a first electrical energy and a display light of a first color by passing through the first portion of the first photoelectric conversion cell and the second photoelectric conversion cell, an initial light from an adjacent one of the sub-pixel units is converted into a second electrical energy and a display light of a second color by passing through the second portion of the first photoelectric conversion cell and the third photoelectric conversion cell, the first electrical energy and the second electrical energy are stored, the display light of the first color and the display light of the second color pass through the second substrate to display an image, and the display light of the first color and the display light of the second color have different wavelengths.

* * * * *